(12) United States Patent
Panwitz

(10) Patent No.: US 6,614,280 B1
(45) Date of Patent: Sep. 2, 2003

(54) VOLTAGE BUFFER FOR LARGE GATE LOADS WITH RAIL-TO-RAIL OPERATION AND PREFERABLE USE IN LDO'S

(75) Inventor: Axil Panwitz, Lenningen (DE)

(73) Assignee: Dialog Semiconductor GmbH, Kirchheim/Tack-Nabern (DE)

( * ) Notice: Subject to any disclaimer, the term of this patent is extended or adjusted under 35 U.S.C. 154(b) by 0 days.

(21) Appl. No.: 10/191,848

(22) Filed: Jul. 9, 2002

(51) Int. Cl.⁷ ................................................ H03L 5/00
(52) U.S. Cl. ......................................... 327/307; 330/9
(58) Field of Search ............................. 327/307, 108, 327/112, 560, 563; 330/9, 253, 261

(56) References Cited

U.S. PATENT DOCUMENTS

| | | | |
|---|---|---|---|
| 4,429,234 A | | 1/1984 | Streit ........................... 307/350 |
| 4,563,597 A | | 1/1986 | Betzold ........................ 307/360 |
| 5,726,597 A | * | 3/1998 | Petty et al. .................. 327/307 |
| 6,046,577 A | | 4/2000 | Rincon-Mora et al. ..... 323/282 |
| 6,072,349 A | * | 6/2000 | Pippin et al. ................ 327/307 |
| 6,124,704 A | | 9/2000 | Annema ....................... 323/313 |
| 6,140,872 A | * | 10/2000 | McEldowney .................. 330/9 |
| 6,157,259 A | | 12/2000 | Dasgupta ..................... 330/296 |
| 6,188,211 B1 | | 2/2001 | Rincon-Mora et al. ..... 323/280 |
| 6,225,857 B1 | | 5/2001 | Brokaw ........................ 327/540 |
| 6,275,094 B1 | * | 8/2001 | Cranford et al. ............. 327/534 |
| 6,388,521 B1 | * | 5/2002 | Henry ........................... 330/258 |
| 6,400,225 B1 | * | 6/2002 | Kruiskamp .................... 330/253 |

* cited by examiner

*Primary Examiner*—Tuan T. Lam
(74) *Attorney, Agent, or Firm*—George O. Saile; Stephen B. Ackerman

(57) ABSTRACT

Described is a low-dropout (LDO) voltage buffer implemented in CMOS with nearly rail-to-ail in/output operation which is capable of driving a large MOS gate. The voltage buffer utilizes a single mismatched input transistor pair with systematic offset which is biased to 350 mV below $V_{dd}$ to operate at a reduced threshold voltage by utilizing the backgate effect (body effect). A dynamic biasing circuit is coupled to the input transistor pair to get high current efficiency. Reduced biasing to restore the full threshold voltage is achieved by shorting out resistive means coupled between the common bulk of the input transistor pair and the common bulk of the biasing circuit.

32 Claims, 3 Drawing Sheets

VOLTAGE BUFFER FOR LARGE GATE LOADS WITH RAIL-TO-RAIL OPERATION AND PREFERABLE USE IN LDO'S

BACKGROUND OF THE INVENTION

1. Field of the Invention

The invention relates to linear integrated circuits, and more particularly to low-dropout (LDO) voltage regulators implemented in CMOS.

2. Description of the Related Art

In the design of a low-dropout (LDO) regulator, which can typically operate with only a 100 mV drop over the output MOS transistor, and also in every linear output stage of an operational amplifier (OPAMP) etc. there is a strong demand for a low-ohmic control of the large gate of the output transistor. This is necessary in order to push the gate pole to high frequencies and to keep the feedback system stable. Often this is done by using an emitter follower. In the standard n-well CMOS technology one can use the pnp transistor formed by the p+ Source/Drain implant (emitter), n-well (base) and p-substrate (collector). With the decreasing feature size of the CMOS technology the current gain (beta) of this bipolar transistor becomes smaller and smaller because of shallower emitters. In a typical 0.7 um technology the beta is about 50 but in a typical 0.35 um technology the beta is only about 5. So the emitter follower does not have any longer an effect.

The common approach for a rail-to-rail buffer would be to use two differential input pairs; one NMOS-input for voltages from $V_{dd}$ to about $N-V_{th}$ (threshold voltage of an NMOS), and one PMOS-input for voltages from $V_{ss}$ to about $N-V_{th}$. Then it is necessary to control the gate voltage from $V_{dd}$ to $V_{ss}$. This approach has a lot of drawbacks. It is quite complex, it needs a double current in the input pairs and there might be the need for a gm-control (transconductance) of the input pairs to keep the buffer stable for all input voltages.

U.S. Patents which relate to LDO devices are:

U.S. Pat. No. 6,225,857 (Brokaw) teaches a driver circuit for an LDO pass device. The circuit is capable of low output impedance, such that when driving a high gate capacitance of a MOS device the resulting pole is moved to a higher frequency than would be otherwise possible.

U.S. Pat. No. 6,188,211 (Rincon-Mora et al.) discloses an LDO voltage regulator circuit comprising MOS and bipolar transistors and a feedback network coupled to an error amplifier.

U.S. Pat. No. 6,046,577 (Rincon-Mora et al.) describes an LDO having a rail-to-rail buffer circuit and incorporates a transient response boost circuit requiring no standby or quiescent current during zero output current load conditions.

Because the above-cited examples of the related art do not satisfy the requirements of the circuit designer to drive a large output gate, a new approach is required. One way is the use of a voltage buffer made by an operational transconductance amplifier (OTA) or an operational amplifier (OPAMP). This buffer must fulfill the following requirements:

- rail-to-rail in/output operation, i.e. it must be able to drive the gate from below the threshold voltage ($V_{th}$), i.e., off-state, to the supply rail, i.e., on-state,
- high current efficiency, i.e., it should have not more current consumption than an emitter follower,
- small silicon area,
- no extra poles,
- stable with high capacitive loads and high bandwidth.

The present invention fulfills these requirements.

SUMMARY OF THE INVENTION

It is an object of at least one embodiment of the present invention to provide circuits and a method for a voltage buffer-with nearly rail-to-rail in/output operation, i.e., it is able to drive the gate from about threshold voltage ($V_{th}$) to the supply rail.

It is another object of the present invention to provide high current efficiency.

It is yet another object of the present invention to minimize the size of the silicon real estate required over the related art.

It is still another object of the present invention to avoid extra voltage buffer poles.

It is a further object of the present invention is to provide a circuit which is stable with high capacitive loads and has a high bandwidth by pushing the gate pole to high frequencies to make the feedback loop stable.

It is yet a further object of the present invention is to provide a circuit which uses standard CMOS devices only.

It is still a further object of the present invention is to reduce power consumption to an absolute minimum.

These and many other objects have been achieved by utilizing a single mismatched input transistor pair which provides systematic offset and operates in the weak inversion mode. With a systematic offset in the input transistor pair the buffer is able to bring the gate voltage of the output MOS transistor to values below $V_{dd-Vth}$ which makes the output MOS transistor nonconductive. Since there is still a sufficient current flow in the buffer it still controls the gate low-ohmic. The biasing of the input transistor pair is controlled by a dynamic biasing circuit as follows. With a low output current the current source for the dynamic biasing circuit is in the linear region and its bias current for the buffer input is near zero. With a high current output the current source is in saturation and the full additional current flows in the buffer input. The current level in the buffer is, therefore, high. Because a separate well is used in the standard CMOS N-well technology the backgate effect (body effect) can be exploited to provide a lower threshold voltage ($V_{th}$) through biasing of the common bulk (body/substrate). The common bulk of the dynamic biasing circuit and of the input transistor pair are coupled via a resistive means providing a voltage drop of typically 350 mV. The common bulk of the input transistor pair is therefore biased at $V_{dd}$–350 mV to reduce the threshold voltage of the input transistor pair. However, when the buffer input voltage is near zero Volt the input pair may come into the linear region and it is desirable to have the highest possible $V_{th}$. This is done by placing a circuit between the common bulks of the dynamic biasing circuit and the input transistor pair which shorts out the resistive means and restores the well potential to $V_{dd}$. A MOS transistor will typically provide this function. Because there will be no current flow in the buffer when the input voltage goes to $V_{dd}$ an additional current source is coupled to the output of the buffer to keep the output at $V_{dd}$. The feedback is made stable by allowing a high gain in it.

These and many other objects and advantages of the present invention will be readily apparent to one skilled in the art to which the invention pertains from a perusal of the claims, the appended drawings, and the following detailed description of the preferred embodiments.

DESCRIPTION OF THE PREFERRED EMBODIMENT

Figure 1:
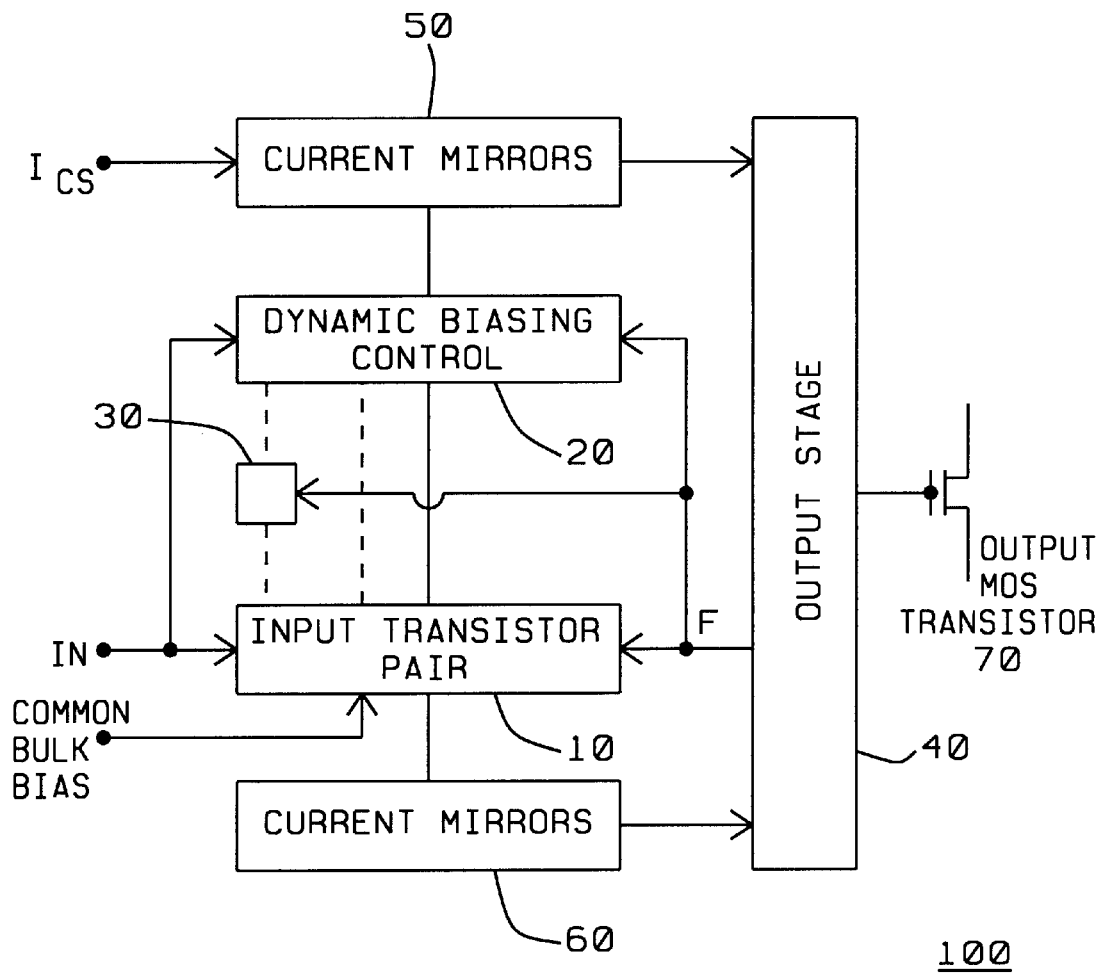
FIG. 1 is a high level block diagram of the preferred embodiment of the present invention.

The invented buffer design disclosed is intended as a replacement for the commonly used emitter follower stage. The Buffer design has 3 main design features (1) The need for only one differential pair with virtually rail-to-rail operation
(2) high current efficiency
(3) low complexity and small area.

The unique idea in the invented buffer is to use only one transistor input pair. That will be a P-input for the typical low-dropout (LDO) voltage buffer with a P-pass device. Or that could be an N-input in case of controlling an N-gate in an operational amplifier (OPAMP), in which case PMOS transistors and NMOS transistors would be swapping places. In the following description of the voltage buffer with an operational transconductance amplifier (OTA) only the use in an LDO will be considered. The background of the idea is that it is only necessary to control the gate solely from Vsc to ($V_{dd}$ minus $V_{th}$ plus 200 mV), i.e., near ground and the output MOS transistor is full open. For gate voltages between $V_{dd}$ and ($V_{th}$ minus 200 mV) the output MOS transistor is OFF. By exploiting a mismatch of the P-input transistors biased in weak inversion it is possible to achieve an offset of about 200 mV and therefore to work below $V_{th}$.

Referring now to FIG. 1, we show a high level block diagram of the main components of voltage buffer 100 of the present invention. A mismatched input transistor pair 10 differentially amplifies an input signal IN and a feedback signal identified by the letter F. The common bulk (body/substrate) of the input transistor pair is further connected to a COMMON BULK BIAS. A dynamic biasing control 20 is coupled to the input transistor pair and biases the input transistor pair and saves power. The dynamic biasing control 20 also receives the input signal IN and feedback signal F. The common bulk of the dynamic biasing control is also coupled to the input transistor pair; this connection is shown in dashed lines. A reducing common bulk bias circuit 30 (typically a transistor) is coupled between the common bulk of the input transistor pair and the dynamic biasing control, and controls the bias of the common bulk of the input transistor pair (the connection is shown in dashed lines). An output stage 40 provides an output signal at the output terminal OUT to drive a large gate load. The output stage provides the feedback signal F to the input transistor pair, the dynamic biasing control, and the common bulk bias. Current mirrors 50, controlled by a current source $l_{cs}$, couple to the dynamic biasing control, the output stage, and the input transistor pair (this connection is not shown). Current mirrors 60 get differential currents from the input transistor pair and provide the gate voltage for the output stage. Output terminal OUT is coupled to the gate of output. MOS transistor 70. The buffer of FIG. 1 must, be able to bring the gate voltage of output MOS transistor 70 to a) ground, turning it fully on; and b) to $V_{dd}$–$V_{th}$ (where $V_{th}$ is approximately 0.9 V) to turn it fully off.

Figure 2:
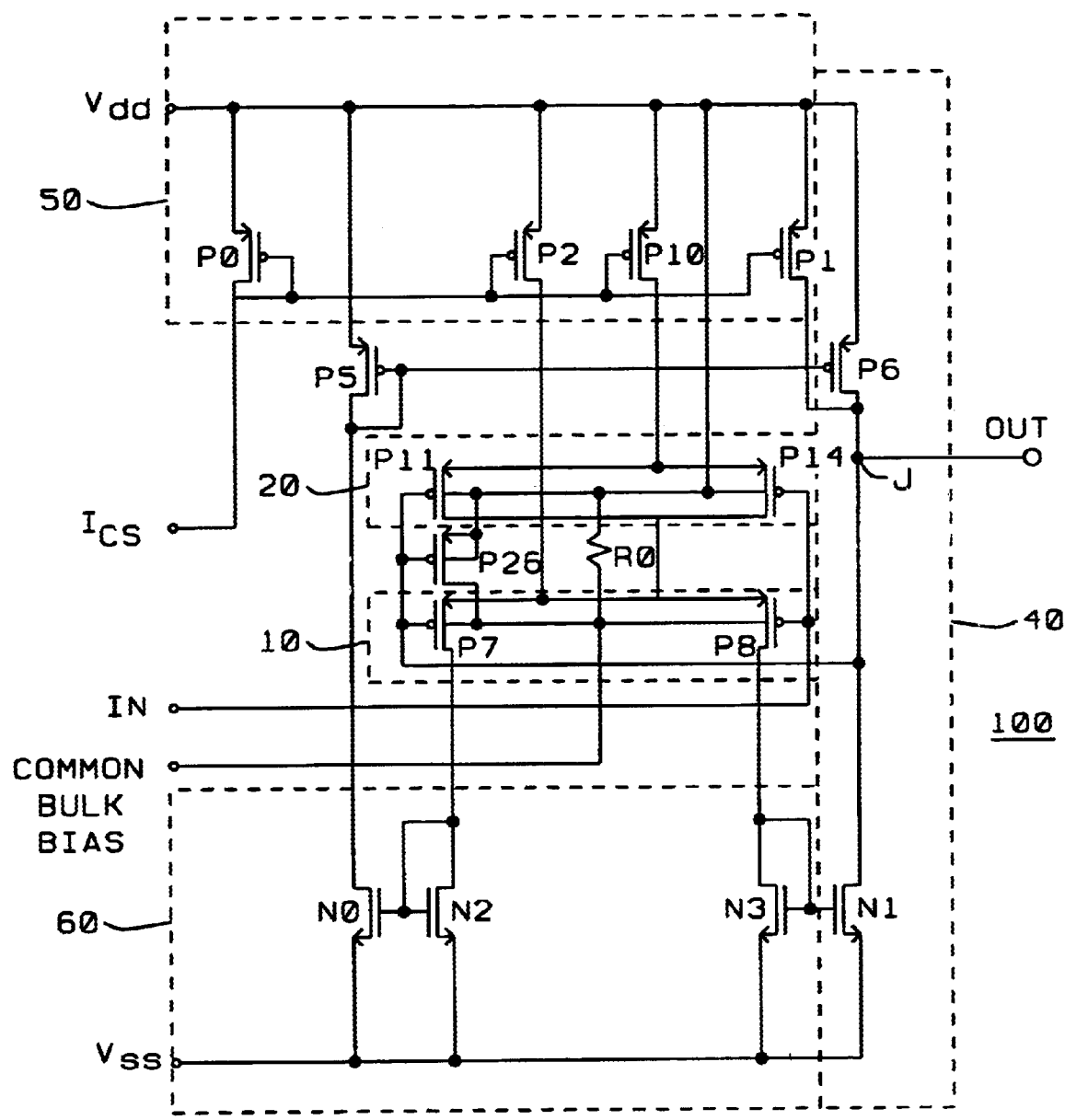
FIG. 2 is a circuit diagram of the preferred embodiment of the present invention.

Referring to the circuit diagram of FIG. 2 and FIG. 1 for voltage buffer 100, we now describe in more detail the preferred the embodiment of the present invention. Mismatched PMOS input transistor pair 10 comprises PMOS transistors P7, P8, which differentially amplify the input signal at terminal IN and feedback signal F generated at junction J of output stage 40. PMOS input transistors P7, P8 have their common bulk coupled to the COMMONBULK BIAS signal. Transistors P7, P8 have their sources coupled together while the drain of first PMOS input transistor P7 is coupled to a first current source NMOS transistor N2 and where the drain of second PMOS input transistor P8 is coupled to a second current source NMOS transistor N3 (N2 and N3 are part of block 60).

Dynamic biasing control 20 comprises PMOS transistors P11 and P14, where P14 receives the input signal at terminal IN and where P11 is coupled to the aforementioned feedback signal F. Transistors P11, P14 are connected in parallel performing an OR function and their common bulk is tied to $V_{dd}$. The drains of P11, P14 are connected to the sources of P7, P8. The common bulk of the PMOS input transistor pair 10 is coupled via resistive means to $V_{dd}$. The resistive means as shown in FIG. 2 is resistor R0 with a resistance of typically 250 kΩ but not limited to that value. R0 biases the common bulk of the input transistor pair to $V_{dd}$–350 mV (typically) to reduce their threshold voltage $V_{th}$. Transistors P7, P8 are biased in the weak inversion region by choosing the proper w/l ratio for them for a certain current level, which allows a voltage swing from the weak inversion region to the voltage of the power supply (nearly rail-to-rail). The sources of P11, P14 are coupled to $V_{dd}$ via current source P10 which needs to have a minimum voltage drop of about 100 mV. The threshold voltage of the input transistor pair is the same as the threshold of the output MOS transistor 70. With a systematic offset in the input transistor pair the buffer is able to bring the gate voltage of the output MOS transistor to values below $V_{th}$, making it nonconductive. But in the buffer itself there is still sufficient current flow for it to provide a low-ohmic control of the gate.

Reducing common bulk bias circuit 30, illustrated in FIG. 2 as PMOS transistor P26, reduces the common bulk bias of PMOS input transistor pair 10. The gate of transistor P26 receives feedback signal F from junction J of output stage 40. The source and common bulk of P26 are connected to $V_{dd}$, and the drain is connected to the bulk of P7, P8. When input voltages are near 0 Volt, the input pair may come into the linear region; it therefore desirable to have the highest possible threshold voltage. This is done by turning transistor P26 on and shorting resistor R0, thus setting the well potential to $V_{dd}$ and achieving the highest possible backgate effect (also referred to as body effect). With low output currents current source P10 is in the linear region and the current is approximately zero. With high output currents, the current source is in saturation and the full additional current flows in the buffer input, the current level in the buffer is therefore high.

Input and output transistors are implemented typically in PMOS, and in standard CMOS N-Well technology are placed in their own well. This allows exploiting the backgate effect to lower the threshold voltage of the input transistor pair.

Output stage 40 comprises PMOS P6 and NMOS transistor N1 coupled in series and connected between power supply $V_{dd}$ and power supply return $V_{ss}$. The output stage provides an output signal at output terminal OUT to drive large gate loads. The common node between the drain of P6 and the source of N1 is junction J which is coupled to terminal OUT.

Block 50 is a first set of current mirrors for providing constant current and which comprise PMOS transistors P0, P2, P10, and P1, their sources all coupled to $V_{dd}$ and their gates to input $1_{CS}$. P2 is a current source for P7 and P8 while P10 is a current source for P11, P14. Current source P10 together with dynamic biasing control 20 achieve high current efficiency. Current source P1 is coupled to junction J and will force the output signal OUT to $V_{gs}=0$ Volt in case input signal IN exceeds the common mode input voltage. If the input voltage at the gate of P6 goes to $V_{dd}$ then there would no longer be any current in the buffer; so the additional current source P1 keeps the output at $V_{dd}$.

Block 60 is a second set of current mirrors for providing constant current and which comprise current mirror N2 and N3. N2 provides, via current mirrors P5 and P6, the current for the gate of P6, while N3 provides current for N1.

Figure 3:
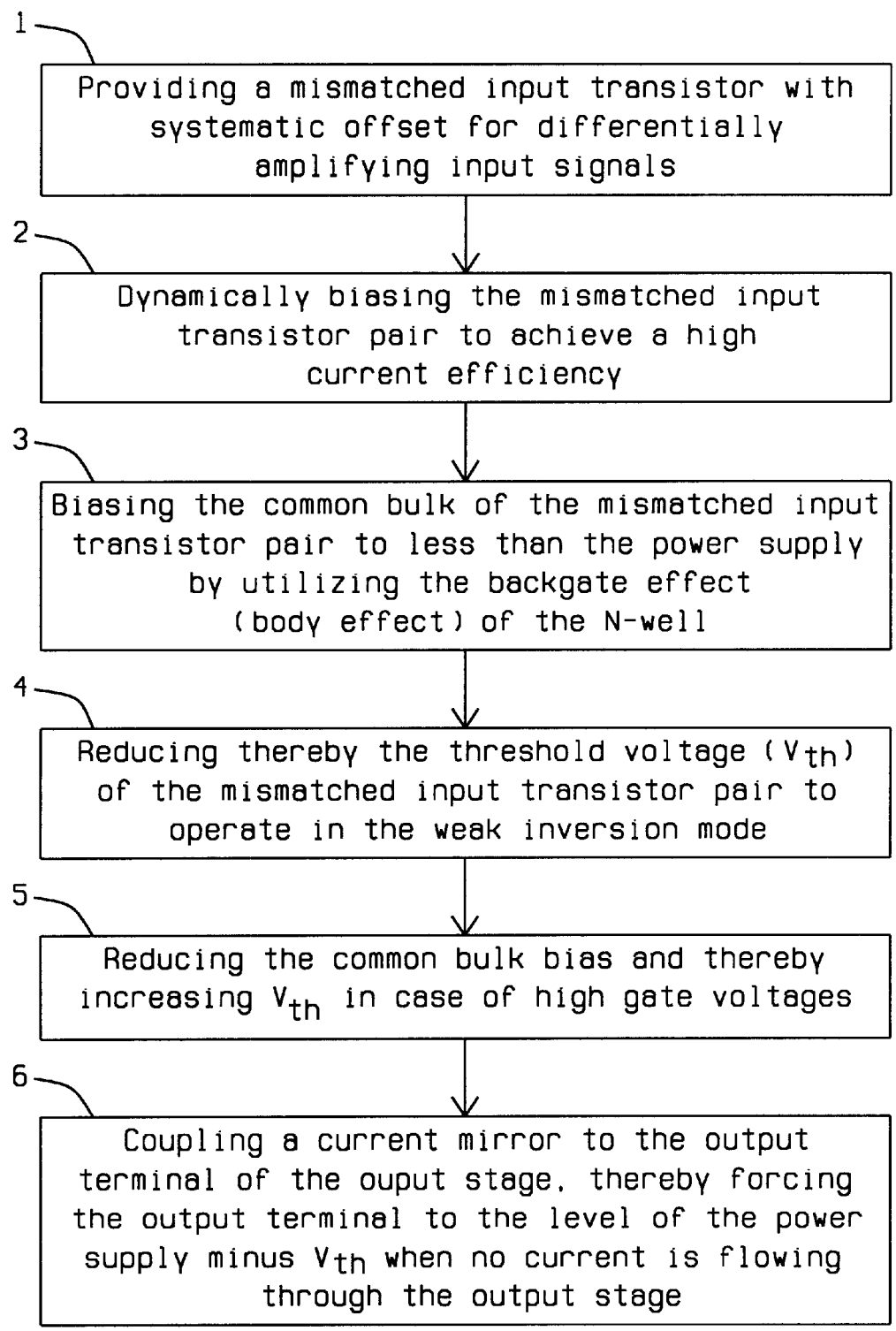
FIG. 3 is a block diagram of the preferred method of the present invention.

We now describe the preferred method of the present invention with reference to FIG. 3. The method of providing a voltage buffer for driving large gate loads with rail-to-rail operation involves:

providing a mismatched input transistor pair with systematic offset for differentially amplifying input signals (see BLOCK 1);

dynamically biasing the mismatched input transistor pair to achieve a high current efficiency (see BLOCK 2);

biasing the common bulk of the mismatched input transistor pair to less than the power supply by utilizing the backgate effect (body effect) of the N-well (see BLOCK 3);

thereby reducing the threshold voltage ($V_{th}$) of the mismatched input transistor pair to operate in the weak inversion mode (see BLOCK 4);

reducing the common bulk bias and thereby increasing $V_{th}$ in case of high gate voltages (see BLOCK 5);

coupling a current mirror to the output terminal of the output stage, thereby forcing the output terminal to the level of the power supply minus $V_{th}$, when no current is flowing through the output stage (see BLOCK 6).

While the invention has been particularly shown and described with reference to the preferred embodiments thereof, it will be understood by those skilled in the art that various changes in form and details may be made without departing from the spirit and scope of the invention.

What is claimed is:

1. A voltage buffer circuit for a low-dropout regulator (LDO), comprising:

a mismatched input transistor pair for differential amplification, said mismatched input transistor pair creating a systematic offset;

a reducing common bulk bias circuit coupled to said mismatched input transistor pair, said reducing common bulk bias circuit reducing the common bulk bias of said mismatched input transistor pair when high output currents flow through an output stage; and said output stage coupled to said input transistor pair, said output stage driving a large gate load.

2. The voltage buffer circuit of claim 1, wherein a dynamic biasing control coupled to said mismatched input transistor pair achieves high current efficiency.

3. The voltage buffer circuit of claim 1, wherein a current mirror in communication with said output stage will force an output of said output stage to the power supply voltage of said output stage when there is no current flowing through said output stage.

4. A voltage buffer circuit for driving large gate loads for a low-dropout regulator (LDO), comprising:

a mismatched input transistor pair for differential amplification, said mismatched input transistor pair creating a systematic offset;

a dynamic biasing control in communication with said mismatched input transistor pair, for dynamically biasing said input transistor pair to achieve high current efficiency, where the common bulk of said dynamic biasing control is in communication with the common bulk of said input transistor pair via resistive means;

an output stage to provide an output signal at an output terminal to drive a large gate load, the input of said output stage in communication with said input transistor; and a reducing common bulk bias circuit for reducing the bias of the common bulk of said input transistor pair.

5. The circuit of claim 4, wherein said dynamic biasing control biases the common bulk of said input transistor pair to less than a power supply voltage.

6. The circuit of claim 4, wherein said dynamic biasing control reduces, the threshold voltage of said input transistor pair.

7. The circuit of claim 4, wherein a current mirror in communication with said output terminal will force said output terminal to the level of said power supply voltage when there is no current flowing through said output stage.

8. The circuit of claim 4, wherein said reducing common bulk bias circuit removes, during high output currents, said bias of the common bulk of said input transistor pair by shorting out said resistive means.

9. The circuit of claim 4, wherein said output stage drives said output signal from a power supply return voltage to a power supply voltage minus the threshold voltage of a MOS transistor.

10. The circuit of claim 4, wherein said systematic offset is driving said output terminal to near the power supply return voltage.

11. The circuit of claim 4, wherein said output terminal still provides low-ohmic control when said output signal at said output terminal is at the level of the power supply minus the threshold voltage of a MOS transistor.

12. A voltage buffer circuit for driving large gate loads for a low-dropout regulator (LDO), comprising:

a mismatched input transistor pair for differentially amplifying an input and a feedback signal, said input transistor pair further coupling a common bulk bias signal to the common bulk of said input transistor pair, said mismatched input transistor pair creating a systematic offset;

a dynamic biasing control for biasing said input transistor pair to achieve high current efficiency, said dynamic biasing control receiving said input signal and said feedback signal, and where said dynamic biasing control is in communication with said input transistor pair;

a reducing common bulk bias circuit for reducing, during high output currents, the bias of the common bulk of said input transistor pair, said reducing common bulk bias circuit receiving said common bulk bias signal, said reducing common bulk bias circuit coupled between said input transistor pair and said dynamic biasing control; and an output stage to provide an output signal at an output terminal to drive a large gate load, the input of said output stage in communication with said input transistor pair, said output stage providing said feedback signal to said input transistor pair, said dynamic biasing control, and said reducing common bulk bias circuit.

13. The circuit of claim 12, wherein the voltage buffer is an operational transconductance amplifier (OTA).

14. The circuit of claim 12, wherein voltage biasing said common bulk of said input transistor pair to less than the power supply voltage reduces the threshold voltage of said input transistor pair.

15. The circuit of claim 14, wherein said input transistor pair operating in weak inversion has a voltage swing ranging from below the threshold voltage to the voltage of the power supply at said output terminal.

16. The circuit of claim 14, wherein said output stage drives said output signal from a power supply return voltage to a power supply voltage minus the threshold voltage of a MOS transistor.

17. The circuit of claim 12, wherein a current mirror in communication with said output terminal will force said output terminal to the level of said power supply voltage when there is no current flowing through said output stage.

18. The circuit of claim 12, wherein the common bulk of said dynamic biasing control is in communication with the common bulk of said input transistor pair via resistive means.

19. The circuit of claim 18, wherein said reducing common bulk bias circuit removes said bias of the common bulk by shorting out said resistive means.

20. The circuit of claim 12, wherein said systematic offset is driving said output terminal to near the power supply return voltage.

21. The circuit of claim 12, wherein said output terminal still provides low-ohmic control when said output signal at said output terminal is at the level of the power supply minus the threshold voltage of a MOS transistor.

22. A voltage buffer circuit for driving large gate loads for a low-dropout regulator (LDO), comprising:
   a mismatched input transistor pair for differentially amplifying an input signal and a feedback signal applied to a first and a second input of said input transistor pair, respectively, said input transistor pair further coupling a common bulk bias signal to the common bulk of said input transistor pair, said mismatched input transistor pair creating a systematic offset,
   a dynamic biasing control for biasing said input transistor pair to achieve high current efficiency, said dynamic biasing control receiving said input signal and said feedback signal, said dynamic biasing, control in communication with said input transistor pair, and where the common bulk of said dynamic biasing control is in communication with the common bulk of said input transistor pair via resistive means;
   a reducing common bulk bias circuit for reducing, during high output currents, the common bulk bias of said input transistor pair, said reducing common bulk bias circuit receiving said common bulk bias signal, said reducing common bulk bias circuit coupled between said input transistor pair and said dynamic biasing control;
   an output stage to provide an output signal at an output terminal to drive a large gate load, the input of said output stage in communication with the drains of said input transistor pair, said output stage providing said feedback signal to said second input of said input transistor pair, said dynamic biasing control, and said reducing common bulk bias; and
   a current mirror in communication with said output terminal of said output stage, where said current mirror will force said output signal to the voltage of said power supply when there is no current flowing through said output stage.

23. The circuit of claim 22, wherein the voltage buffer is an operational transconductance amplifier (OTA).

24. The circuit of claim 22, wherein voltage biasing of said common bulk of said input transistor pair to less than the power supply voltage reduces the threshold voltage of said input transistor pair.

25. The circuit of claim 24, wherein said input transistor pair operating in weak inversion achieves a voltage swing ranging from below the threshold voltage to the voltage of the power supply at said output terminal.

26. The circuit of claim 22, wherein said dynamic biasing control is comprised of two transistors, their sources coupled together and their drains coupled together.

27. The circuit of claim 22, wherein said reducing common bulk bias circuit removes said bias of the common bulk by shorting out said resistive means.

28. The circuit of claim 22, wherein said systematic offset is driving said output terminal to near the power supply return voltage.

29. The circuit of claim 22, wherein said output terminal still provides low-ohmic control when said output signal at said output terminal is at the level of the power supply minus the threshold voltage of a MOS transistor.

30. A method of providing a voltage buffer to drive large gate loads for a low-dropout regulator (LDO), comprising, the steps of:
   a) providing a mismatched input transistor pair with systematic offset for differentially amplifying input signals;
   b) dynamically biasing said mismatched input transistor pair to achieve a high current efficiency;
   c) biasing the common bulk of said mismatched input transistor pair to less than the power supply by utilizing the backgate effect (body effect) of the N-well;
   d) reducing thereby the threshold voltage ($V_{th}$) of said mismatched input transistor pair to operate in the weak inversion mode;
   e) eliminating the common bulk bias and thereby increasing the threshold voltage $V_{th}$ in case of high gate voltages; and
   f) coupling a current mirror to the output terminal of the output stage, thereby forcing said output terminal to the level of the power supply minus the threshold voltage $V_{th}$ when no current is flowing through said output stage.

31. The method of claim 30, wherein said systematic offset is driving said output terminal to near the power supply return voltage.

32. The method of claim 30, wherein said output terminal still provides low-ohmic control when the signal at said output terminal is at the level of the power supply minus the threshold voltage $V_{th}$.

* * * * *

UNITED STATES PATENT AND TRADEMARK OFFICE
CERTIFICATE OF CORRECTION

PATENT NO.    : 6,614,280 B1                                         Page 1 of 1
DATED         : September 2, 2003
INVENTOR(S)   : Axel Pannwitz It is certified that error appears in the above-identified patent and that said Letters Patent is hereby corrected as shown below:

Title page,
Item [75], Inventors, delete "Axil Panwitz, Lenningen (DE)" and replace it with
-- Axel Pannwitz, Lenningen (DE) --.

Signed and Sealed this

Ninth Day of December, 2003

JAMES E. ROGAN
*Director of the United States Patent and Trademark Office*